(12) United States Patent
Egawa

(10) Patent No.: US 6,870,249 B2
(45) Date of Patent: Mar. 22, 2005

(54) SEMICONDUCTOR DEVICE AND MANUFACTURING METHOD THEREOF

(75) Inventor: Yoshimi Egawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/722,419

(22) Filed: Nov. 28, 2003

(65) Prior Publication Data

US 2004/0119162 A1 Jun. 24, 2004

(30) Foreign Application Priority Data

Dec. 24, 2002 (JP) ......................................... 2002-372734

(51) Int. Cl.[7] .......................... H01L 23/02; H01L 23/48
(52) U.S. Cl. ........................ 257/686; 257/692; 257/777
(58) Field of Search ............................. 257/686, 690, 257/692, 693, 698, 734, 777, 778

(56) References Cited

U.S. PATENT DOCUMENTS

| 5,324,888 | A | * | 6/1994 | Tyler et al. ................ 174/52.2 |
| 6,335,565 | B1 | * | 1/2002 | Miyamoto et al. .......... 257/686 |
| 6,353,263 | B1 | * | 3/2002 | Dotta et al. ................. 257/777 |
| 6,424,050 | B1 | | 7/2002 | Komiyama ................. 257/777 |
| 6,455,927 | B1 | * | 9/2002 | Glenn et al. ................ 257/686 |
| 6,548,330 | B1 | * | 4/2003 | Murayama et al. ......... 438/127 |
| 6,791,195 | B2 | * | 9/2004 | Urushima ................... 257/783 |
| 2002/0047214 | A1 | | 4/2002 | Morinaga et al. ........... 257/778 |
| 2004/0089936 | A1 | * | 5/2004 | Shizuno ...................... 257/686 |

FOREIGN PATENT DOCUMENTS

| JP | 63-52461 | 3/1988 |
| JP | 11-297927 | 10/1999 |
| JP | 2001-94045 | 4/2001 |
| JP | P2001-94045 | 4/2001 |
| JP | 2002-124625 | 4/2002 |
| JP | P2002-124625 | 4/2002 |
| JP | 2003-224228 | 8/2003 |

* cited by examiner

*Primary Examiner*—T. N. Quach
(74) *Attorney, Agent, or Firm*—Rabin & Berdo, P.C.

(57) ABSTRACT

To provide a semiconductor device that is capable of reduction in thickness and high-density mounting, and that is simple in manufacturing process and convenient for use. A wiring substrate is formed with a plurality of opening portions. In each of the opening portions, a lower chip formed by a wafer-level chip size package (WCSP) is received, and an upper chip is placed on the lower chip. The composite including them is sealed by a sealing body such as epoxy resin. Internal connection terminals of each lower chip are electrically connected to pads of the corresponding upper chip via wirings, through holes and bonding posts of the wiring substrate, and wires.

19 Claims, 9 Drawing Sheets

FIG.6
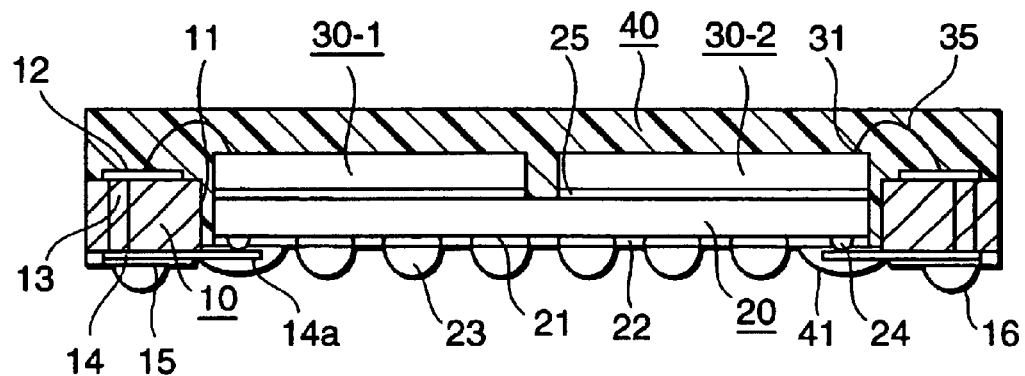
FIG.7A
FIG.7D
FIG.7B
FIG.7E
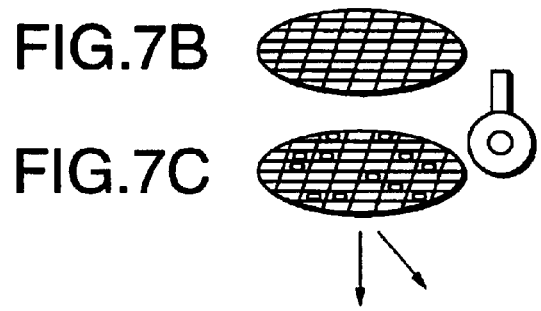
FIG.7C
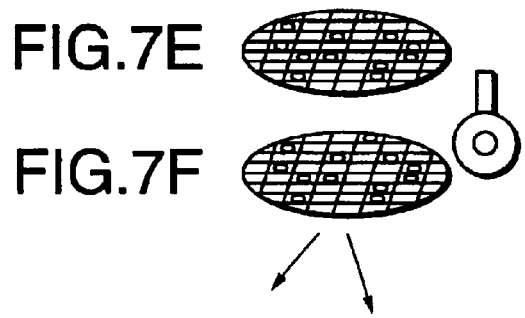
FIG.7F

SEMICONDUCTOR DEVICE AND MANUFACTURING METHOD THEREOF

BACKGROUND OF THE INVENTION

1. Field of the Invention

The present invention relates to a semiconductor device and a manufacturing method thereof and, in particular, relates to a semiconductor device that is capable of reduction in thickness and high-density mounting and that is simple in manufacturing process, and further relates to a manufacturing method of such a semiconductor device.

This application is counterpart of Japanese patent application, Serial Number 372734/2002, filed Dec. 24, 2002, the subject matter of which is incorporated herein by reference.

2. Description of the Related Art

Conventionally, as semiconductor devices capable of high-density mounting, there have been known semiconductor devices of a multi-chip package (hereinafter referred to as "MCP") structure in which a plurality of semiconductor elements (hereinafter referred to as "chips") are mounted within one package.

For example, when two chips having chip sizes equal to or approximately equal to each other are stacked in an MCP of a two-chip stacked type, the lower chip is fixed onto a substrate using a bonding material, then a spacer such as a silicon piece or tape is fixed onto the lower chip using a bonding material, and wiring is implemented from the lower chip to bonding posts on the substrate using the wire bonding technique. Then, the upper chip is fixed onto the spacer using a bonding material, and wiring is implemented from the upper chip to the bonding posts on the substrate using the wire bonding technique. Subsequently, the lower chip, the upper chip and the wiring are sealed using resin, and then terminals are attached to the underside of the substrate.

However, there are drawbacks about the foregoing MCP that inasmuch as the spacer is used, a three-chip stacked structure is resulted so that not only the thickness of the whole package is increased, but also assembling steps are increased to raise material cost and assembling cost.

In view of this, as MCP structure semiconductor devices that have solved such drawbacks, there have been proposed those as described, for example, in the following patent literatures 1 and 2.

[Patent Literature 1]
JP-A-2001-94045
[Patent Literature 2]
JP-A-2002-124625

In each of the semiconductor devices described in the patent literatures 1 and 2, a substrate is formed with an opening portion leading from its front surface to its back surface, and a lower chip is received in the opening portion with its front surface facing downward. Onto a back surface of the lower chip, for example, a back surface of an upper chip that is the same as or approximately the same as the lower chip is fixed. Wiring is carried out from the upper chip to bonding posts on the front surface of the substrate using the wire bonding technique, and the upper chip and the wiring are sealed with resin. Terminals are provided on the back surface of the substrate and electrically connected to the bonding posts on the front surface thereof via through holes. Accordingly, for electrical connection between the upper chip and the lower chip, wiring is carried out from the lower chip to the terminals on the back surface of the substrate using the wire bonding technique, or the lower chip and the terminals on the back surface of the substrate are connected on the side of an external device.

The foregoing MCP can solve the foregoing drawbacks because the chips having the chip sizes equal to or approximately equal to each other can be stacked in a two-chip fashion without using a spacer.

However, there has been the following problem with respect to the conventional semiconductor devices of the foregoing patent literatures 1 and 2.

When electrically connecting the upper chip and the lower chip to each other, the wiring is carried out from the lower chip to the terminals on the back surface of the substrate using the wire bonding technique, or the lower chip and the terminals on the back surface of the substrate are connected on the side of the external device. Therefore, there has been a problem that the thickness of the whole package is increased by a height of the wiring on the side of the lower chip, or that inasmuch as the lower chip and the terminals on the back surface of the substrate should be electrically connected on the side of the external device, an extra connecting operation is required to deteriorate the convenience of use.

SUMMARY OF THE INVENTION

It is an object of the present invention to solve the foregoing prior art problem, and provide a semiconductor device that is capable of reduction in thickness and high-density mounting, and that is simple in manufacturing process and convenient for use, and further provide a manufacturing method of such a semiconductor device.

According to one aspect of the present invention, there is provided a semiconductor device which includes a wiring substrate having a first surface, a second surface opposed to the first surface, and an opening portion extending from the first surface to the second surface; a terminal formed on the first surface; a wiring formed on the second surface and having one end portion projected to the opening portion and electrically connected to the terminal; a first semiconductor element having a third surface formed with a first external terminal and an internal connection terminal outside of the first external terminal, and a fourth surface opposed to the third surface, the first semiconductor element being received in the opening portion such that the internal connection terminal is placed on and electrically connected to the inner end portion of the wiring; a second semiconductor element having a fifth surface formed with an electrode, and a sixth surface opposed to the fifth surface, the sixth surface being attached on the fourth surface; a conductor electrically connecting the electrode of the second semiconductor element and the terminal of the wiring substrate; and a sealing member sealing the first and second semiconductor elements and the conductor.

According to another aspect of the present invention, there is provided a method of manufacturing a semiconductor device which includes the following steps.

The method includes preparing a wiring substrate having confronting first and second surfaces wherein an opening portion is formed leading from the first surface to the second surface, a terminal is formed on the first surface near the opening portion, a wiring electrically connected to the terminal via a through hole is formed on the second surface, and an inner end portion of the wiring is projected into the opening portion by a predetermined length; positioning an internal connection terminal of a first semiconductor element having a third surface formed with a first external terminal and further formed with the internal connection terminal outside of the first external terminal near an outer edge thereof, and a fourth surface confronting the third surface, positioning the inner end portion of the wiring projected into the opening portion, and inserting the first semiconductor element into the opening portion so as to place the internal connection terminal on the inner end portion of the wiring and electrically connect the internal connection terminal to the inner end portion; fixing onto the fourth surface a sixth surface of a second semiconductor element having a fifth surface formed with an electrode and the sixth surface confronting the fifth surface; electrically connecting the electrode of the second semiconductor element to the wiring of the wiring substrate via a conductor; and sealing the first and second semiconductor elements and the conductor by a sealing body.

The above and further objects and novel features of the invention will more fully appear from the following detailed description, appended claims and the accompanying drawings.

BRIEF DESCRIPTION OF THE DRAWINGS

FIG. 6 is an enlarged sectional view of a semiconductor device showing a fifth embodiment of the present invention;

FIGS. 7A to 7J are manufacturing process diagrams showing a semiconductor device manufacturing method according to a sixth embodiment of the present invention.

DESCRIPTION OF THE PREFERRED EMBODIMENT

First Embodiment (Structure)

Figure 1A:
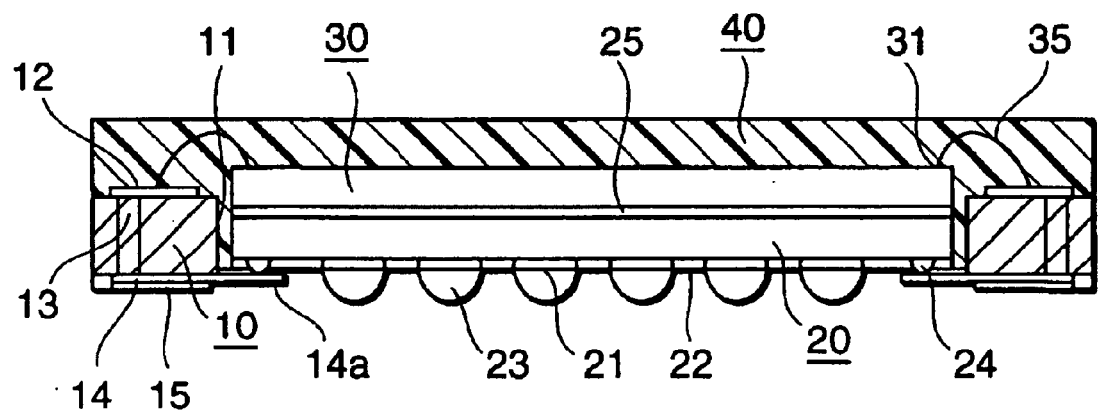
FIGS. 1A and 1B are structural diagrams of a semiconductor device showing a first embodiment of the present invention.
Figure 1B:
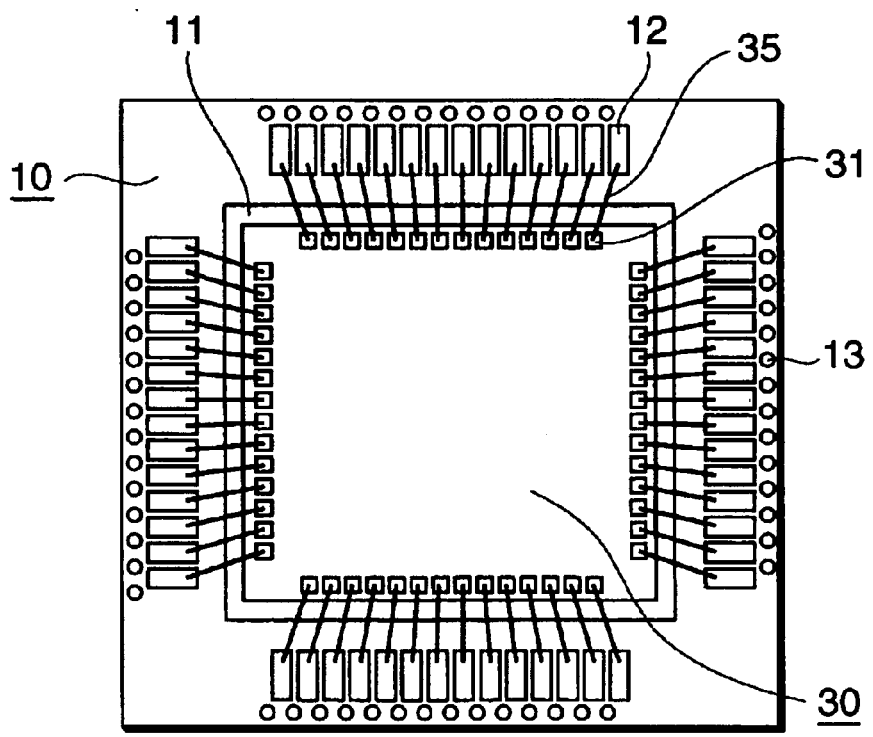
Figure 2A:
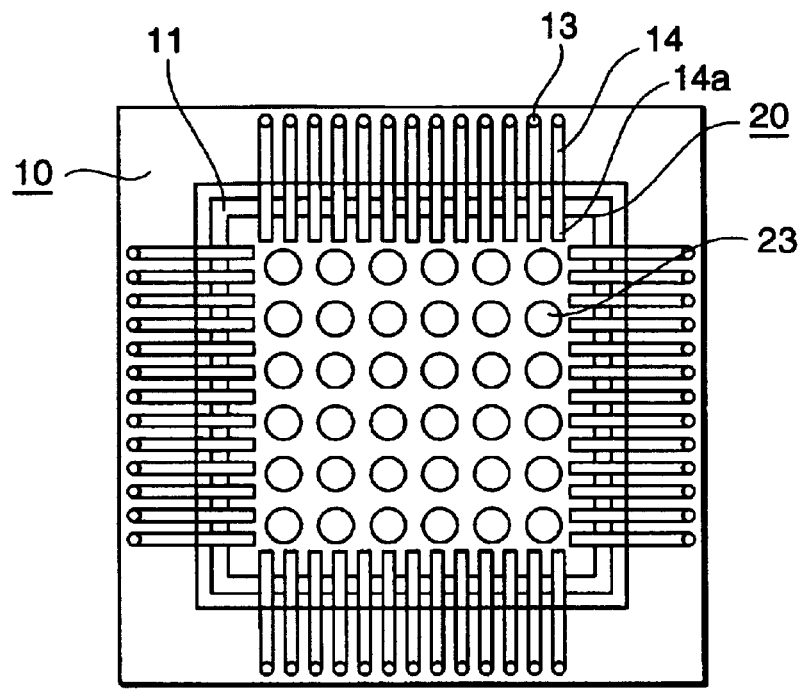
FIGS. 2A and 2B are structural diagrams of the semiconductor device showing the first embodiment of the present invention.
Figure 2B:
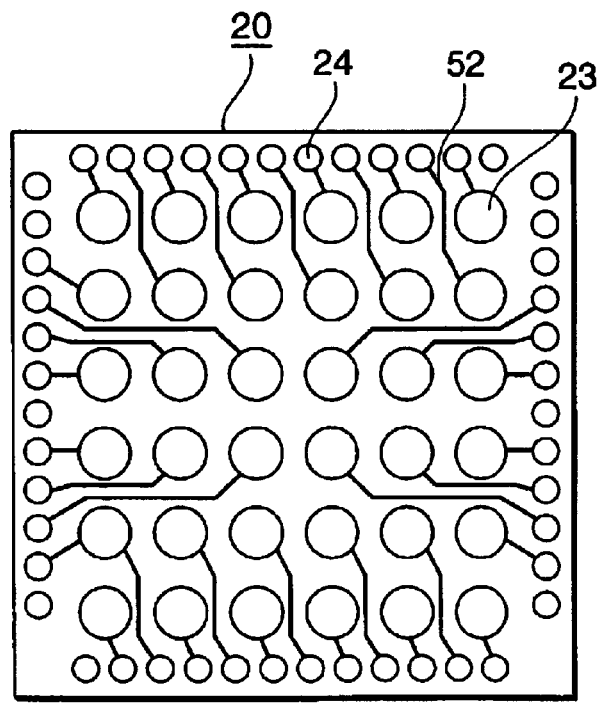

FIGS. 1A and 1B are structural diagrams of a semiconductor device showing a first embodiment of the present invention, wherein FIG. 1A is an enlarged sectional view and FIG. 1B is a plan view before sealing. FIGS. 2A and 2B are structural diagrams of the semiconductor device, wherein FIG. 2A is a bottom view of the semiconductor device and FIG. 2B is a plan view of a first chip in the semiconductor device.

This semiconductor device, for example, has a fine pitch ball grid alley (hereinafter referred to as "FBGA") structure with a pitch of 0.8 mm or less in an equal-chip-size two-chip stacked MCP structure, and comprises a wiring substrate 10 in the form of a glass epoxy substrate, a polyimide substrate, or the like. At a predetermined portion of the wiring substrate 10, there is formed an opening portion 11 having a predetermined shape (e.g. rectangular) and size and passing through the wiring substrate 10 from a first surface (e.g. front surface) thereof to a second surface (e.g. back surface) thereof.

A plurality of terminals (e.g. bonding posts) 12 made of predetermined metal (e.g. Cu+Ni+Au) are disposed around the opening portion 11 on the front surface of the wiring substrate 10. The bonding posts 12 are connected to a plurality of wirings 14 on the back surface side of the wiring substrate 10 via a plurality of through holes 13. The wirings 14 are disposed around the opening portion 11, and an inner end portion 14a of each wiring 14 is projected into the opening portion 11 by a predetermined length (e.g. 100·m to 200·m). Each wiring 14 is made of Cu or the like, and its inner end portion 14a is plated with Sn, solder or the like. The back surface of the wiring substrate 10 and the wirings 14 disposed thereon are all covered with an insulating film 15 made of epoxy resin or the like.

A first chip 20 having a size smaller than that of the opening portion 11 (e.g. a lower chip smaller than the opening portion 11 by 0.1 mm or more) is inserted into the opening portion 11 and placed on the inner end portions 14a of the wirings 14. The lower chip 20 is, for example, in the form of a WCSP including therein circuit elements such as a memory and a logic circuit. The lower chip 20 is formed with a plurality of first external terminals 23 on a third surface (e.g. front surface) thereof and further formed with a plurality of internal connection terminals 24 near the outer edge thereof outside of the external terminals 23, and these external terminals 23 and internal connection terminals 24 are connected to the internal circuit elements. The internal connection terminals 24 of the lower chip 20 are placed in position on the inner end portions 14a and fixed thereto, respectively.

On a fourth surface (e.g. back surface) of the lower chip 20, a sixth surface (e.g. back surface) of a second chip (e.g. upper chip) 30 having a shape substantially the same as that of the lower chip 20 is fixed using a bonding material 25 such as an insulating epoxy bonding agent. The chip having substantially the same shape represents a chip having substantially the same size irrespective of whether it is of the same kind or has different functions. Further, dispersion in size generated upon manufacturing respective chips is not taken into consideration, and those chips are deemed to have substantially the same shape. The upper chip 30 includes therein circuit elements such as a memory and a logic circuit. A plurality of electrodes (e.g. Al pads) 31 are formed near the outer edge of a fifth surface (e.g. front surface) of the upper chip 30, and these pads 31 are connected to the internal circuit elements.

Conductors (e.g. Au wires using the wire bonding technique) 35 are arranged extending from the pads 31 of the upper chip 30 to the bonding posts 12 of the wiring substrate 10, respectively. The upper surface and side surfaces of the upper chip 30, the upper surface of the wiring substrate 10, and a gap portion defined between inner wall surfaces of the opening portion 11 and side surfaces of the lower chip 20 are sealed by a sealing body 40 such as epoxy resin.

For example, the WCSP forming the lower chip 20 comprises a substrate such as a silicon substrate formed with circuit elements, wherein a plurality of electrodes (e.g. Al pads) are formed on a front surface of this substrate, and these pads are covered with an insulating film such as a polyimide coat. On the insulating film on the front surface side, a plurality of bump-like Cu posts 21 having a predetermined size and connected to the pads are formed so as to be arranged two-dimensionally by redistribution wirings 52. The whole surface on the side of the posts 21 is sealed by a sealing body 22 such as epoxy resin, then ground until the posts 21 are exposed. When the thickness of the WCSP is small, the surface of the substrate is also ground. On the exposed posts 21, the first external terminals 23 and the internal connection terminals 24 are formed using, for example, solder balls or solder paste. The external terminals 23 and the internal connection terminals 24 have the same structure, while each external terminal 23 has a diameter and a height that are greater than those of each internal connection terminal 24.

According to a manufacturing method, for example, the wiring substrate 10 is formed with a plurality of the opening portions 11, then the lower chip 20 and the upper chip 30 are mounted in each of the opening portions 11, then the composite is simultaneously sealed by the sealing body 40, and then the sealed composite is cut at portions around the respective opening portions 11 into individual pieces each having a predetermined size so that semiconductor devices of the FBGA structure are manufactured.

(Operation)

The internal connection terminals 24 of the lower chip 20 are electrically connected to the pads 31 of the upper chip 30 via the wirings 14, the through holes 13 and the bonding posts 12 of the wiring substrate 10, and the wires 35, respectively. Thus, when the external terminals 23 of the semiconductor device are mounted on a circuit board or the like, the circuit board or the like and the lower and upper chips 20 and 30 are electrically connected so that the semiconductor device performs a predetermined operation.

(Effect)

According to the first embodiment, the following effects (1) to (3) are accomplished.

(1) Inasmuch as the lower chip 20 and the upper chip 30 are electrically connected to each other via the wirings 14 and the through holes 13 of the wiring substrate 10, and the wires 35, it is not necessary to mutually connect the lower chip 20 and the upper chip 30 on the side of the circuit board or the like so that the conventional extra connecting operation becomes unnecessary to improve the convenience of use.

(2) The lower chip 20 is received in the opening portion 11 of the wiring substrate 10 with the front surface side of the lower chip 20 facing downward, and the upper chip 30 of the equal chip size is fixed onto the back surface side of the lower chip 20 with the back surface side of the upper chip 30 facing downward, so that the reduction in thickness and the high-density mounting are made possible.

(3) The lower chip 20 having the chip size equal to that of the upper chip 30 has the WCSP structure and the wiring substrate 10 is formed with the opening portion 11, so that it is possible to improve the productivity because of reduction in material cost and reduction in the number of manufacturing steps, and further improve reflow resistance as compared with the conventional three-chip stacked structure.

Second Embodiment (Structure)

Figure 3:
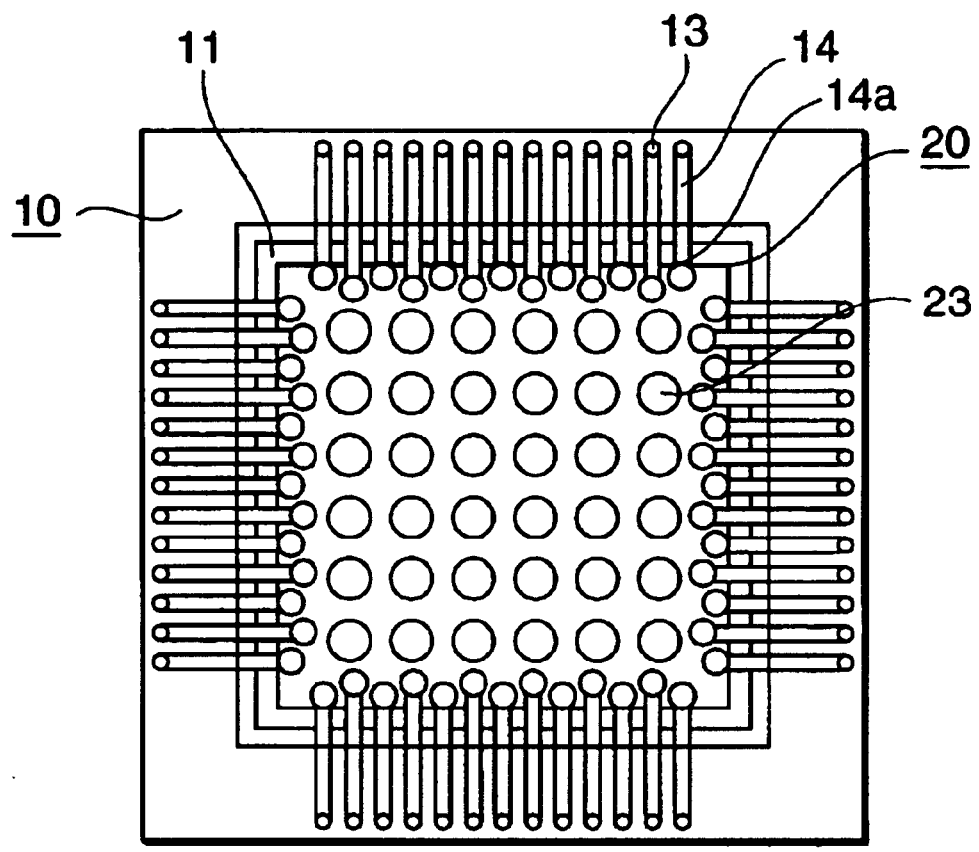
FIG. 3 is a bottom view of a semiconductor device showing a second embodiment of the present invention.

FIG. 3 is a bottom view of a semiconductor device showing a second embodiment of the present invention, wherein those elements common to the elements in FIGS. 1A, 1B, 2A and 2B showing the first embodiment are assigned the same reference symbols.

Like in the first embodiment, the semiconductor device in this embodiment has the FBGA structure in the equal-chip-size two-chip stacked MCP structure. This semiconductor device differs from the semiconductor device in the first embodiment in that inner end portions 14a of a plurality of wirings 14 projected into the opening portion 11 on the back surface side of the wiring substrate 10 are each formed round and large and are arranged zigzag so as to increase contact areas and, correspondingly, a plurality of internal connection terminals 24 formed on a front surface of a lower chip 20 are also arranged zigzag.

Like in the first embodiment, the wirings 14 are made of Cu or the like, and the inner end portions 14a thereof each projecting into the opening portion 11 by a predetermined length (e.g. 100·m to 200·m) are plated with Sn, solder or the like. The internal connection terminals 24 formed on the front surface side of the lower chip 20 are placed in position on the inner end portions 14a and fixed thereto, respectively. The other structure is the same as that in the first embodiment.

According to a manufacturing method, like in the first embodiment, for example, the wiring substrate 10 is formed with a plurality of the opening portions 11, then the lower chip 20 and the upper chip 30 are mounted in each of the opening portions 11, then the composite is simultaneously sealed by the sealing body 40, and then the sealed composite is cut at portions around the respective opening portions 11 into individual pieces each having a predetermined size so that semiconductor devices of the FBGA structure are manufactured.

(Operation)

Like in the first embodiment, the internal connection terminals 24 disposed zigzag on the front surface side of the lower chip 20 are electrically connected to the pads 31 of the upper chip 30 via the inner end portions 14a of the wirings 14 disposed zigzag on the back surface side of the wiring substrate 10, the through holes 13 and the bonding posts 12 of the wiring substrate 10, and the wires 35, respectively. Therefore, the lower chip 20 and the upper chip 30 are electrically connected to each other so that the semiconductor device implements a predetermined operation.

(Effect)

According to the second embodiment, in addition to effects similar to those of the first embodiment, the following effect is further accomplished.

For example, when the wiring pitch of the plurality of wirings 14 becomes 100·m or less, the connection areas between the internal connection terminals 24 and the wirings 14 become smaller to reduce the connection strength. In view of this, in this embodiment, by zigzag arranging the distal ends of the inner end portions 14a of the wirings 14, each distal end portion can be increased in size, thereby to improve the connection strength.

Third Embodiment (Structure etc.)

Figure 4A:
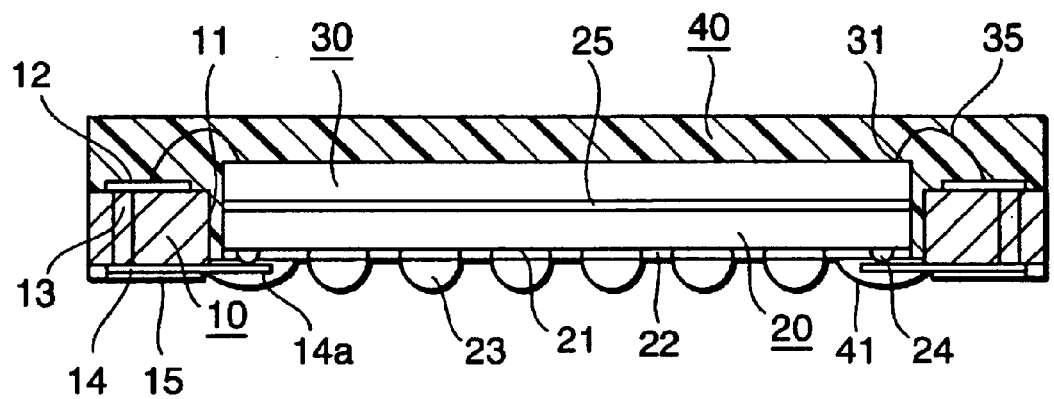
FIGS. 4A and 4B are structural diagrams of a semiconductor device showing a third embodiment of the present invention.
Figure 4B:
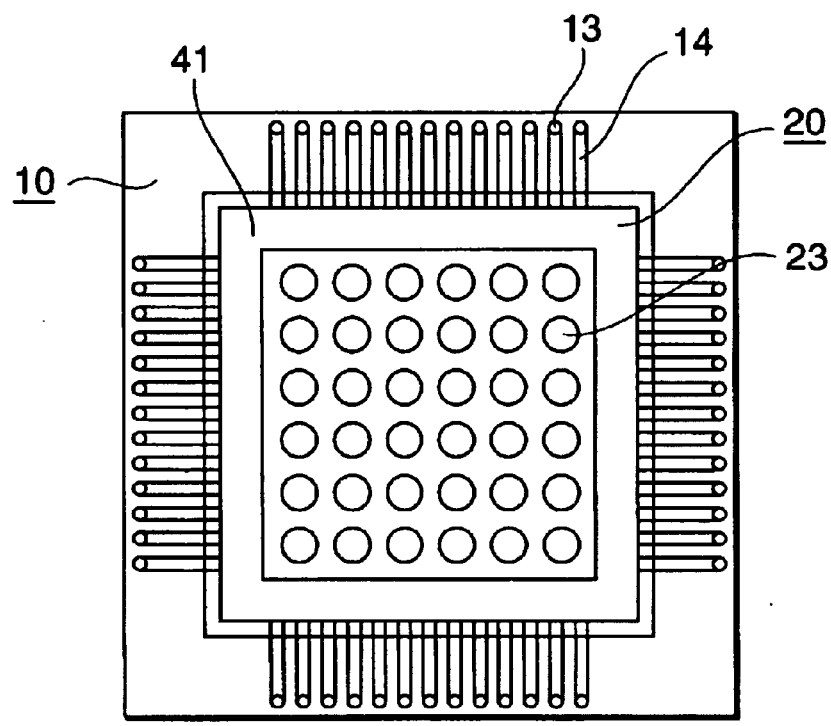

FIGS. 4A and 4B are structural diagrams of a semiconductor device showing a third embodiment of the present invention, wherein FIG. 4A is an enlarged sectional view, while FIG. 4B is a bottom view. In FIGS. 4A and 4B, those elements common to the elements in FIGS. 1A, 1B, 2A, 2B and 3 showing the first and second embodiments are assigned the same reference symbols.

Like in the first and second embodiments, the semiconductor device in this embodiment has the FBGA structure in the equal-chip-size two-chip stacked MCP structure. This semiconductor device differs from the semiconductor devices in the first and second embodiments in that, even if the front surface side of the wiring substrate 10 is sealed by the sealing body 40, the connecting portions between the inner end portions 14a of the wirings 14 and the internal connection terminals 24 are exposed, and thus, after the sealing by the sealing body 40, insulating members 41 such as liquid sealing resin are applied to such connecting portions and then hardened, and thereafter, the whole composite is cut into pieces of a predetermined size, thereby providing the FBGA structure. The other structure is the same as those in the first and second embodiments.

(Effect)

According to the third embodiment, in addition to effects similar to those of the first and second embodiments, the following effect is further accomplished.

Inasmuch as the exposed portions of the connecting portions between the inner end portions 14a of the wirings 14 and the internal connection terminals 24 are covered with the insulating members 41, the exposed portions are protected to improve the reliability of the connecting portions.

Fourth Embodiment (Structure etc.)

Figure 5A:
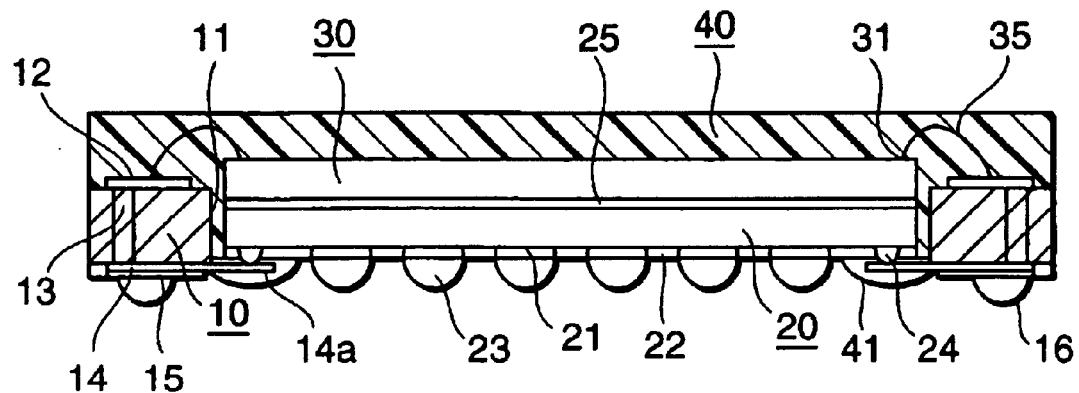
FIGS. 5A and 5B are structural diagrams of a semiconductor device showing a fourth embodiment of the present invention.
Figure 5B:
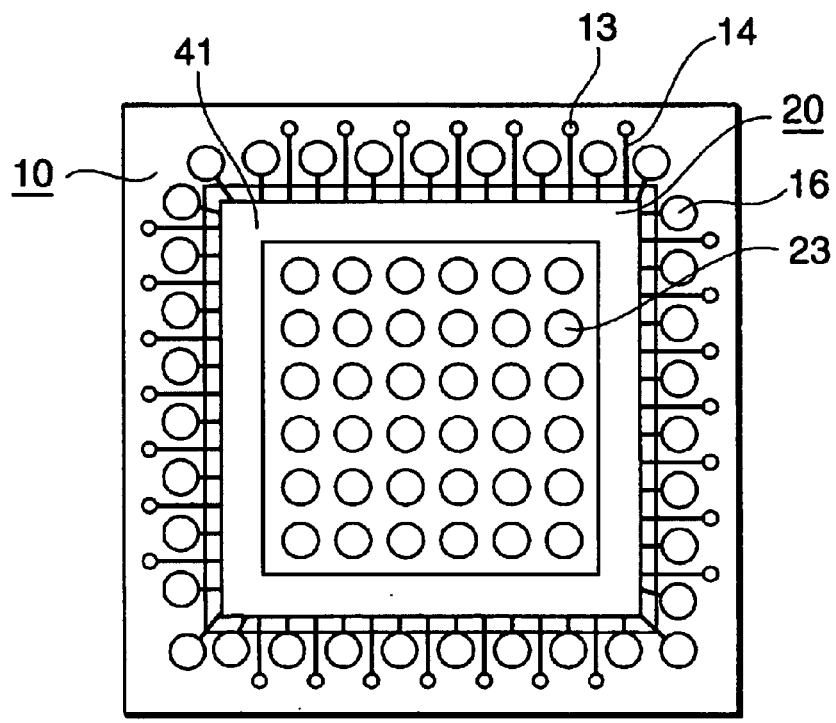

FIGS. 5A and 5B are structural diagrams of a semiconductor device showing a fourth embodiment of the present invention, wherein FIG. 5A is an enlarged sectional view, while FIG. 5B is a bottom view. In FIGS. 5A and 5B, those elements common to the elements in FIGS. 4A and 4B showing the third embodiment are assigned the same reference symbols.

Like in the third embodiment, the semiconductor device in this embodiment has the FBGA structure in the equal-chip-size two-chip stacked MCP structure. In this semiconductor device, a plurality of second external terminals 16 in the form of solder balls or the like are disposed so as to be projected on the back surface of the wiring substrate 10 near the outer edge thereof, in addition to the structure of the third embodiment. The external terminals 16 are connected to the through holes 13 or the internal connection terminals 24 via the wirings 14. The other structure is the same as that in the third embodiment.

(Effect)

According to the fourth embodiment, in addition to effects similar to those of the third embodiment, the following effect is further accomplished.

If it is configured that the external terminals 16 provided on the back surface of the wiring substrate 10 are connected to the through holes 13 via the wirings 14, because the pads 31 of the upper chip 30 can be directly drawn out to the exterior via the through holes 13 and the external terminals 16, the wiring length can be shortened to improve the electrical characteristic. On the other hand, if it is configured that the external terminals 16 are connected to the internal connection terminals 24 on the side of the lower chip 20 via the wirings 14, because the number of the external terminals is restricted when provided only on the front surface of the lower chip 20, the number of the external terminals can be increased by providing the external terminals 16 on the side of the wiring substrate 10.

Fifth Embodiment (Structure etc.)

FIG. 6 is an enlarged sectional view of a semiconductor device showing a fifth embodiment of the present invention, wherein those elements common to the elements in FIGS. 5A and 5B showing the fourth embodiment are assigned the same reference symbols.

Like in the fourth embodiment, the semiconductor device in this embodiment has the FBGA structure in the equal-chip-size two-chip stacked MCP structure. In this semiconductor device, a plurality of upper chips 30-1 and 30-2 are used instead of one upper chip 30 in the fourth embodiment. Back surfaces of these upper chips 30-1 and 30-2 are fixed onto the back surface of the lower chip 20 with a predetermined interval between the upper chips 30-1 and 30-2 using the bonding material 25, and a plurality of pads 31 on the front surface side of each of the upper chips 30-1 and 30-2 are connected to the bonding posts 12 on the front surface side of the wiring substrate 10 via wires 35. The upper chips 30-1 and 30-2 and the wires 35 are sealed by the sealing body 40. The other structure is the same as that in the fourth embodiment.

(Effect)

According to the fifth embodiment, in addition to effects similar to those of the fourth embodiment, the function can be improved with one package by mounting the chips 20, 30-1 and 30-2 of different kinds. Three or more upper chips 30-1 and 30-2 may be provided.

Sixth Embodiment (Manufacturing Method)

FIGS. 7A to 7J are manufacturing process diagrams showing a semiconductor device manufacturing method according to a sixth embodiment of the present invention, and FIGS. 8A to 8I are manufacturing process diagrams for manufacturing lower chips shown in FIGS. 7A to 7C and 7H to 7J. In FIGS. 7A to 7J and 8A to 8I, those elements common to the elements in FIGS. 1A, 1B, 2A and 2B showing the first embodiment are assigned the same reference symbols.

In this embodiment, the semiconductor device of FIGS. 1A, 1B, 2A and 2B showing the first embodiment is manufactured by, for example, the following manufacturing processes (1) to (6).

(1) Lower Chip Forming Process of FIGS. 7A to 7C

In an element forming process of FIG. 7A, for example, many lower chips 20 each in the form of a WCSP are formed so as to be regularly arrayed using a silicon wafer 50. Then, in a probing process of FIG. 7B, the respective lower chips 20 are measured by a prober to mark defectives, thereby classifying them into defectives and nondefectives. Then, in a dicing process of FIG. 7C, the composite is divided, by cutting, into the individual lower chips 20 for incorporation into packages, respectively.

A specific example of such manufacturing processes is shown in FIGS. 8A to 8I.

Figure 8A:
FIGS. 8A to 8I are manufacturing process diagrams for manufacturing lower chips shown in FIGS. 7A to 7C and 7H to 7J.
Figure 8B:
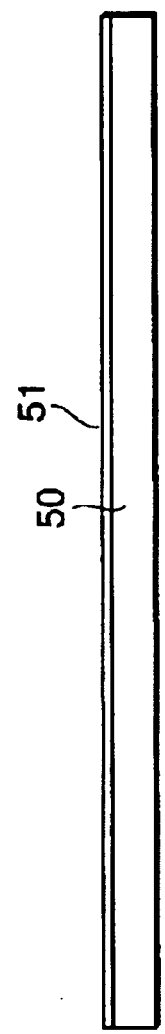
Figure 8C:
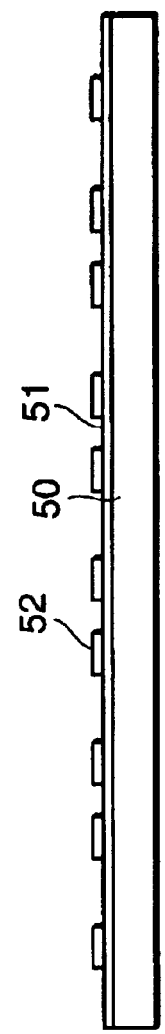
Figure 8D:
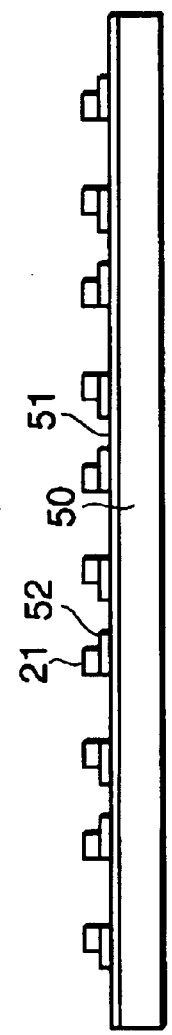

In FIG. 8A, for example, circuit elements are formed in the silicon wafer 50 through diffusion, photo etching, etc., and many electrodes (e.g. Al pads) are formed on a front surface of the silicon wafer 50. Then, in FIG. 8B, the whole front surface is covered with an insulating film 51 such as a polyimide coat. Then, in FIG. 8C, redistribution wirings 52 plated with Cu or the like are formed on the insulating film 51 for pad relocation. These redistribution wirings 52 are electrically connected to the pads under the insulating film 51 at predetermined portions. Then, in FIG. 8D, a plurality of bump-like Cu posts 21 having a predetermined size are formed on the redistribution wirings 52.

Figure 8E:
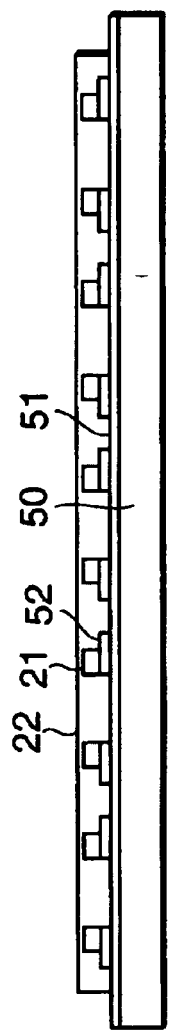
Figure 8F:
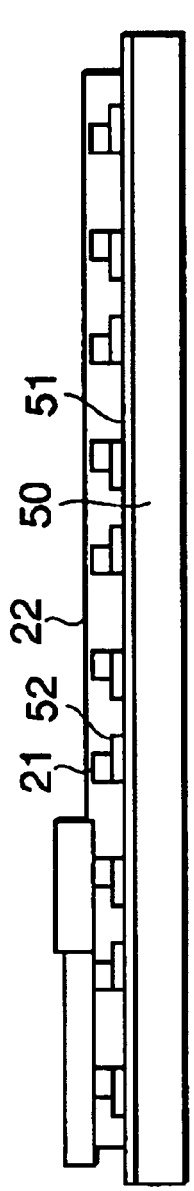
Figure 8G:
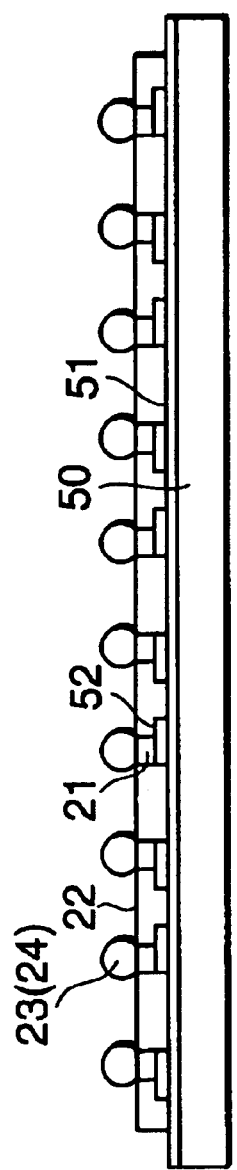
Figure 8H:
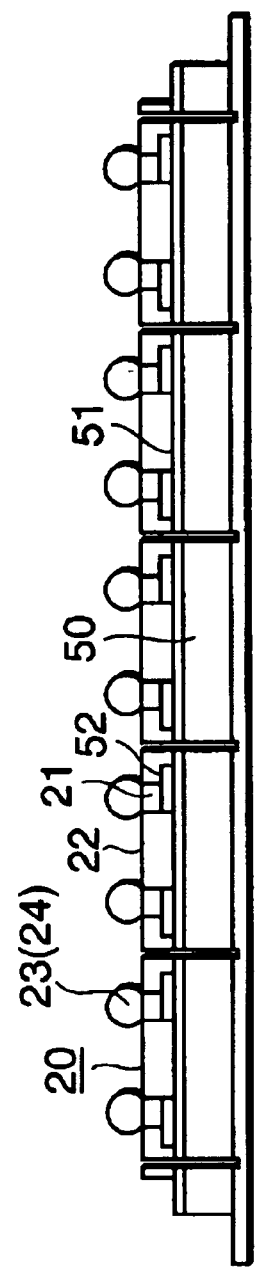
Figure 8I:
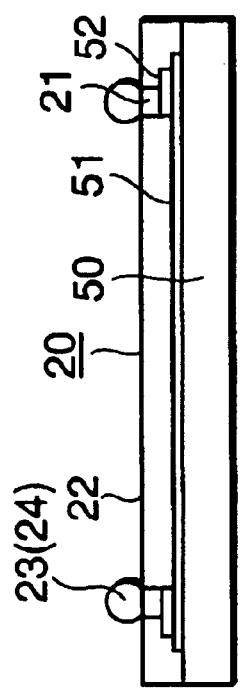

Then, in FIG. 8E, the whole surface including the posts 21 is sealed by a sealing body 22 such as epoxy resin using a transfer technique, and in FIG. 8F, the sealing body 22 is ground until the posts 21 are exposed. In FIG. 8G, on the exposed posts 21 are formed external terminals 23 in the form of solder balls or the like having a large diameter and height, and also formed internal connection terminals 24 with a small diameter and height using solder paste or the like. In FIG. 8H, defectives and nondefectives are classified through the probing process, and then the composite is divided into the respective lower chips 20 through the dicing process. Subsequently, in FIG. 8I, the appearance is checked so that only nondefectives are used in the next process.

(2) Upper Chip Forming Process of FIGS. 7D to 7F

In parallel to the foregoing lower chip forming process (1), in an element forming process of FIG. 7D, for example, many upper chips 30 are formed so as to be regularly arrayed using a silicon wafer 60, and many electrodes (e.g. Al pads) 31 are formed on a front surface of each upper chip 30. Then, in a probing process of FIG. 7E, the respective upper chips 30 are measured by a prober to mark defectives, thereby classifying them into defectives and nondefectives. Then, in a dicing process of FIG. 7F, the composite is divided, by cutting, into the individual upper chips 30 for incorporation into packages, respectively.

Figure 7G:
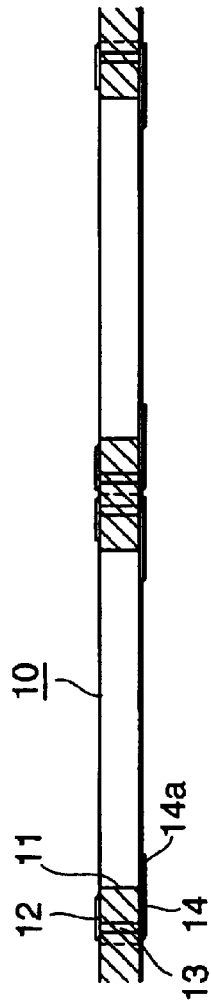

(3) Wiring Substrate Preparing Process of FIG. 7G

A wiring substrate 10 formed with a plurality of opening portions 11 etc. is prepared in advance.

The wiring substrate 10 is in the form of a glass epoxy substrate, a polyimide substrate or the like, and is formed with the opening portions 11 at predetermined portions thereof. A plurality of bonding posts 12 made of, for example, Cu+Ni+Au are disposed on a front surface of the wiring substrate 10 around the opening portions 11, and are connected to a plurality of wirings 14 on the back surface side of the wiring substrate 10 via a plurality of through holes 13. The wirings 14 are disposed around the opening portions 11 and, for example, inner end portions 14a thereof are projected into the opening portions 11 by about 100·m to 200·m, respectively. The back surface of the wiring substrate 10 and the wirings 14 disposed thereon are all covered with an insulating film 15 made of epoxy resin or the like.

Figure 7H:
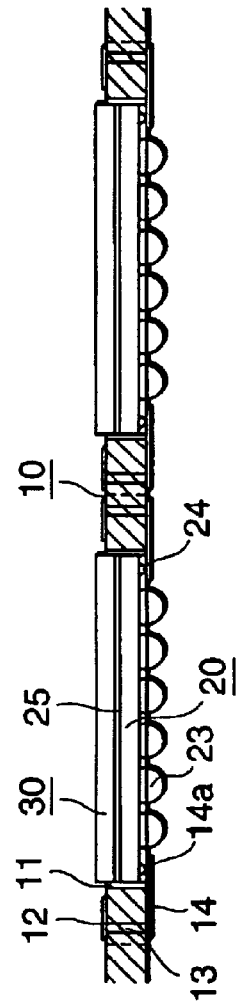

(4) Die Bonding Process of FIG. 7H

The internal connection terminals 24 of the lower chips 20 divided in FIG. 7C are positioned, inserted into the opening portions 11 of the wiring substrate 10, placed on the inner end portions 14a of the wirings 14, and fixed thereto. Then, the back surfaces of the upper chips 30 divided in FIG. 7F are fixed onto the back surfaces of the lower chips 20 via a bonding material 25 such as an insulating epoxy bonding agent or the like, respectively.

Figure 7I:
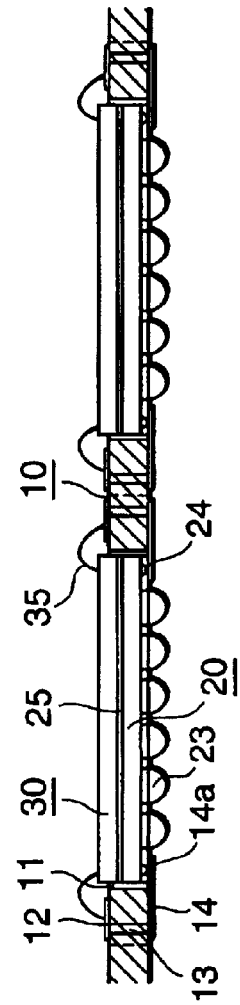

(5) Wire Bonding Process of FIG. 7I

Wires 35 are arranged from the pads 31 of the upper chips 30 to the bonding posts 12 of the wiring substrate 10 using the wire bonding technique.

Figure 7J:
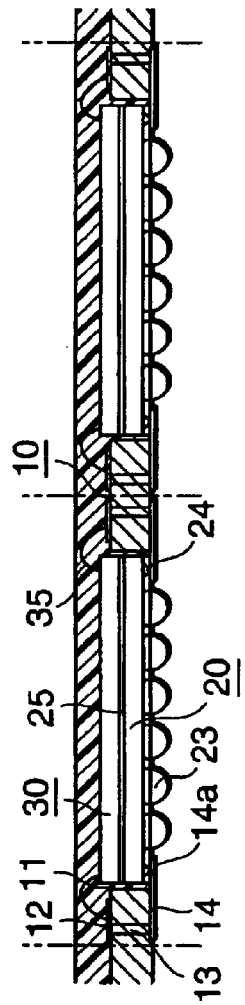

(6) Sealing-Individualizing Process of FIG. 7J

The upper surfaces and side surfaces of the upper chips 30, the upper surface of the wiring substrate 10, and gap portions between inner wall surfaces of the opening portions 11 and side surfaces of the lower chips 20 are sealed by a sealing body 40 such as epoxy resin.

Thereafter, the sealed composite is cut at portions around the respective opening portions 11 into individual pieces each having a predetermined size, thereby to obtain a plurality of FBGA-structure semiconductor devices, so that the manufacturing processes are completed.

(Effect)

In the manufacturing method of the sixth embodiment, the lower chip 20 having the chip size equal to that of the upper chip 30 has the WCSP structure and is received in the opening portion 11 of the wiring substrate 10, so that it is possible to improve the productivity because of reduction in material cost and reduction in the number of manufacturing steps, and further improve reflow resistance as compared with the conventional three-chip stacked structure.

Application Manner

The present invention is not limited to the foregoing embodiments, and various modifications and using manners are possible. As such modifications or using manners, there are, for example, the following (a) and (b).

(a) It is possible to suitably combine the first to fifth embodiments. Further, in the first to fifth embodiments, it is possible to change the shapes, structures, materials, etc. into ones other than those shown in the figures.

(b) The manufacturing method of the sixth embodiment is also applicable to the second to fifth embodiments. Further, the used materials, the manufacturing method, the processing order, etc. shown in the figures can be changed suitably.

Effect of the Invention

As described above in detail, according to the semiconductor device of the present invention, inasmuch as the first chip and the second chip are electrically connected to each other via the wirings and conductors of the wiring substrate, it is not necessary to mutually connect the first and second chips on the side of the circuit board or the like, so that the conventional extra connecting operation becomes unnecessary to improve the convenience of use. Further, the first chip is received in the opening portion of the wiring substrate with the front surface side of the first chip facing downward, and the second chip is fixed onto the back surface side of the first chip with the back surface side of the second chip facing downward, so that the reduction in thickness and the high-density mounting are made possible.

By providing the second external terminals on the back surface of the wiring substrate, the electrodes of the second chip can be directly drawn out to the exterior, so that the wiring length can be shortened to improve the electrical characteristic. Further, inasmuch as the number of the external terminals is restricted when provided only on the front surface of the first chip, the number of the external terminals can be increased by providing the second external terminals on the side of the wiring substrate.

By constituting the second chip of a plurality of chips, the function can be improved with one package.

By zigzag arranging the distal ends of the inner end portions of the wirings, each distal end portion can be increased in size, thereby to improve the connection strength.

The exposed portions of the connecting portions between the inner end portions of the wirings and the internal connection terminals are covered with the insulating members, so that the exposed portions are protected to improve the reliability of the connecting portions.

According to the semiconductor device manufacturing method of the present invention, the first chip has, for example, the WCSP structure and is received in the opening portion of the wiring substrate, so that it is possible to improve the productivity because of reduction in material cost and reduction in the number of manufacturing steps, and further improve reflow resistance as compared with the conventional three-chip stacked structure.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
 a wiring substrate having a first surface, a second surface opposed to the first surface, and an opening portion extending from the first surface to the second surface;
 a terminal formed on the first surface;
 a wiring formed on the second surface and having one end portion projected to the opening portion and electrically connected to the terminal;

a first semiconductor element having a third surface formed with a first external terminal and an internal connection terminal outside of the first external terminal, and a fourth surface opposed to the third surface, the first semiconductor element being received in the opening portion such that the internal connection terminal is placed on and electrically connected to the inner end portion of the wiring;

a second semiconductor element having a fifth surface formed with an electrode, and a sixth surface opposed to the fifth surface, the sixth surface being attached on the fourth surface;

a conductor electrically connecting the electrode of the second semiconductor element and the terminal of the wiring substrate; and a sealing member sealing the first and second semiconductor elements and the conductor.

2. A semiconductor device according to claim 1, wherein the first semiconductor element is formed by a wafer-level chip size package in which the internal connection terminal and the first external terminal are relocated by redistribution wiring from an internal electrode being coated in an insulating layer.

3. A semiconductor device according to claim 1, wherein the terminal and the wiring on the wiring substrate are electrically connected to each other via a through hole.

4. A semiconductor device according to claim 1, further comprising a second external terminal projected on the second surface of the wiring substrate and electrically connected to the wiring.

5. A semiconductor device according to claim 1, wherein the second semiconductor element comprises a plurality of chips and are mounted on the fourth surface of the first semiconductor element.

6. A semiconductor device according to claim 1, wherein a plurality of wirings are formed on the second surface of the wiring substrate, and inner end portions thereof are arranged in staggered form and projected into the opening portion.

7. A semiconductor device according to claim 1, wherein the second surface of the wiring substrate and the wiring on the second surface are covered with an insulating film.

8. A semiconductor device according to claim 6, wherein connecting portions each between the inner end portion of the wiring and the internal connection terminal are covered with an insulating member.

9. A semiconductor device comprising:

a wiring substrate having a first surface, a second surface opposed to the first surface, and a substantially centrally located aperture extending from the first surface to the second surface;

a bonding post formed on the first surface near the aperture;

a conductive trace formed on the second surface and having one end projected to the aperture and electrically connected to the bonding post;

a first semiconductor chip having a third surface formed with a first terminal and a second terminal outside of the first terminal, and a fourth surface opposed to the third surface, the first semiconductor chip being received in the aperture such that the second terminal is placed on and electrically connected to the one end of the conductive trace;

a second semiconductor chip having a fifth surface formed with an electrode pad, and a sixth surface opposed to the fifth surface, the sixth surface being attached to the fourth surface;

a bonding wire electrically connecting the electrode pad of the second semiconductor chip and the bonding post of the wiring substrate; and a sealing member sealing the first and second semiconductor chips and the bonding wire.

10. A semiconductor device according to claim 9, wherein the first semiconductor chip comprises a chip size package in which the first and second terminals are relocated by redistribution wiring from an electrode pad being coated in an insulating layer.

11. A semiconductor device according to claim 9, wherein the bonding post and the conductive trace on the wiring substrate are electrically connected to each other via a through hole.

12. A semiconductor device according to claim 9, further comprising a third terminal formed on the second surface of the wiring substrate and electrically connected to the conductive trace.

13. A semiconductor device according to claim 9, wherein the second semiconductor chip comprises a plurality of chips and are mounted on the fourth surface of the first semiconductor chip.

14. A semiconductor device according to claim 9, wherein a plurality of conductive trace are formed on the second surface of the wiring substrate, and a plurality of one ends thereof are arranged in staggered form and projected into the aperture.

15. A semiconductor device according to claim 9, wherein the second surface of the wiring substrate and the conductive trace on the second surface are covered with an insulating film.

16. A semiconductor device according to claim 14, wherein connecting portions each between the one end portion of the conductive trace and the second terminal are covered with an insulating member.

17. A semiconductor device comprising:

a base substrate having a first surface, a second surface opposed to the first surface, and a substantially centrally located aperture extending from the first surface to the second surface;

a plurality of bonding posts formed on the first surface along the aperture;

a plurality of conductive traces formed on the second surface and electrically connected to the bonding post, each of the conductive traces having one end projected to the aperture and the other end located at the second surface;

a first semiconductor element having a third surface formed with first terminals located at the center of the third surface and second terminals located at the periphery of the third surface, and a fourth surface opposed to the third surface, the first semiconductor element being received in the aperture and being supported by the one ends of the conductive traces;

a second semiconductor element having a fifth surface formed with electrode pads, and a sixth surface opposed to the fifth surface, the sixth surface being attached to the fourth surface;

a plurality of bonding wires electrically connecting the electrode pads and the bonding posts; and a sealing member sealing the first and second semiconductor elements and the bonding wire.

18. A semiconductor device according to claim 17, wherein the first terminals are arranged in a matrix form.

19. A semiconductor device according to claim 18, wherein the first semiconductor element includes a plurality of electrode pads formed on the third surface and along an edge of the first semiconductor element, and redistribution wirings coupling the first terminals and the electrode pads.

* * * * *